Jan. 15, 1963 R. L. BRIGHT 3,073,970

RESISTOR COUPLED TRANSISTOR LOGIC CIRCUITRY

Filed Nov. 25, 1960 2 Sheets-Sheet 1

WITNESSES

Leon J. Taga

Leon M. Garman

INVENTOR

Richard L. Bright

BY Ernest P. Klipfel

ATTORNEY

Jan. 15, 1963 R. L. BRIGHT 3,073,970

RESISTOR COUPLED TRANSISTOR LOGIC CIRCUITRY

Filed Nov. 25, 1960 2 Sheets-Sheet 2

United States Patent Office 3,073,970
Patented Jan. 15, 1963

3,073,970
RESISTOR COUPLED TRANSISTOR LOGIC CIRCUITRY

Richard L. Bright, Hempfield Township, Westmoreland County, Pa., assignor to Westinghouse Electric Corporation, East Pittsburgh, Pa., a corporation of Pennsylvania Filed Nov. 25, 1960, Ser. No. 71,646
7 Claims. (Cl. 307—88.5)

The present invention relates generally to logic circuitry and more particularly to a resistor coupled transistor logic circuit.

It is very desirable to provide an encapsulated standard building block for use in logic circuitry. One such standard building block is the circuit as described and claimed in the copending application Serial No. 628,332, filed December 14, 1956, by William D. Rowe, and assigned to the same assignee. Such a circuit is a very attractive universal logic building block in that any logic function can be fabricated by appropriate combinations of such blocks.

The simple packaged unit shown and described in the aforementioned application is generally referred to as a non-compensated NOR logic circuit because the magnitude of the output voltage depends on the number of stages being driven; the more being driven, the lower the voltage will be. Hence, some of the value of a standard building block is lost since the application of such blocks in a logic network is limited by the maximum allowable collector voltage of the transistor and the drop of output voltage with an increase in the number of connected loads.

The present invention provides a logic circuitry which is truly a basic building block capable of connection in any logic network. The present invention provides an automatically compensated logic circuit wherein the output voltage is kept constant for any number of stages to be driven so long as the safe operating switching characteristics of the transistor are not exceeded.

Accordingly, an object of the present invention is to provide a new and improved resistor coupled transistor logic element.

Another object of the present invention is to provide an automatically compensated logic element.

Another object is to provide a logic circuit wherein the input voltage to following stages remains constant regardless of the number of stages connected.

Another object of the present invention is to provide a compensated NOR logic element.

Another object of the present invention is to provide a NOT-AND logic element.

Another object of the present invention is to provide a universal logic building block capable of separate encapsulation for use in any logic network.

Another object of the present invention is to provide a standard building block capable of switching a large variety of output devices or combination of devices.

Further objects and advantages of the present invention will be readily apparent from the following detailed description taken in conjunction with the drawing, in which.

Figures 1, 2:
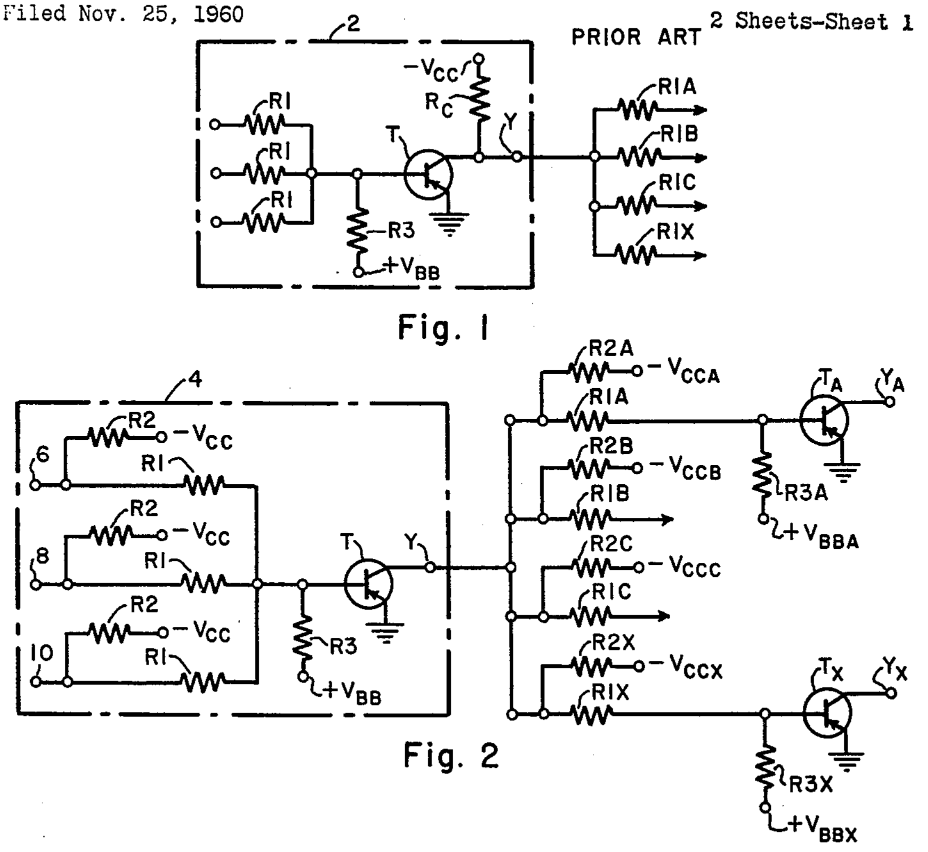
FIGURE 1 is a schematic diagram of a logic element of the prior art.
FIG. 2 is a schematic diagram of an illustrative embodiment of the present invention.

The resistor coupled transistor logic circuit shown in FIG. 1 is in accordance with the prior art and is generally referred to as a non-compensated NOR element. The NOR element 2 comprises a transistor of suitable type herein shown as a PNP type and indicated by the reference character T. The transistor T has a base electrode, an emitter electrode and a collector electrode. The emitter electrode is shown connected to ground. The base electrode is connected to a plurality of input terminals through a respective one of a plurality of isolating impedances R1. Any number of input terminals and isolating impedances may be used within limits to be defined hereinafter. A biasing resistor R3 connects the base electrode to a source of positive potential, $V_{BB}$, while a current limiting collector resistor $R_C$ connects the collector electrode to a source of negative voltage $V_{CC}$. The collector electrode is also connected to an output terminal Y, which in turn may be connected to a plurality of inputs RIA, RIB, RIC, . . . RIX of following logic elements.

In operation, the positive voltage supply $V_{BB}$ biases the transistor T to cut off through the resistor R3. If no signal is present at any of the input terminals, the transistor T is in its non-conductive state and an output will appear at the terminal Y which will be approximately the value of the potential of the negative supply $V_{CC}$. If a negative potential signal is applied to one or more of the input terminals, the transistor T becomes highly conductive, simulating a switch in the closed position, and effectively grounding the output terminal Y so that there will be no output at that terminal.

The logic building block used in a logic network has encapsulated the fixed resistors R1, R3 and $R_C$ as well as the transistor T. Any number of inputs up to the maximum provided in a basic package can be connected to the outputs of preceding similar elements, and any unused inputs or terminals are left unconnected. Any number of inputs of following similar elements connected as a load up to a maximum number, determined by the safe operating capabilities of the transistor T, may be driven from the output terminal Y of any given logic element 2.

In forming a basic building block for use in logic networks, it is very desirable that the element be flexible in application. Such an element must be capable of connection to a number of stages to be driven as loads. The number can vary as demanded by the system network logic. Herein is the chief difficulty with the non-compensated NOR element 2 since the output voltage depends upon the number of stages being driven. As more input resistors of following stages are added to the collector resistance $R_C$ of the non-compensated NOR logic element 2, the output voltage across the connected input resistors RIA, RIB, RIC, RIX of the following stages will decrease, and it is possible to overload a particular NOR logic element so that the input signal to the following stages is insufficient to switch the following stages. The more stages being driven, the lower the voltage will be.

The non-compensated NOR element 2 has the disadvantage that the circuit parameters must be chosen to satisfy both of the following conditions:

(1) The signal voltage, existing when only one input terminal of a following element is connected as a load to the output terminal Y, must not exceed the maximum allowable collector voltage.

(2) The lower voltage existing when the maximum allowable number of input terminals is connected to the output terminal Y must still be sufficient to drive each of the following elements into saturation.

One form of NOR element individually compensated by the circuit designer differs from the non-compensated NOR element of the prior art shown in FIG. 1 only in that the collector resistor $R_C$ is not a fixed value included in the basic encapsulated package but is inserted as a separate component and has a value depending upon the number of stages driven such that the output voltage is kept constant. Such an arrangement is satisfactory if the logic network system is to be built up by inserting individual components in a printed circuit. However, if a separately encapsulated standard building block is desired, the extra odd-valued resistor is a nuisance requiring engineering time to calculate the value of the collector-resistor $R_C$ to be used. Additional assembly and inspection time is also involved.

A logic circuit element in accordance with the present invention that avoids the aforementioned difficulties is shown in FIG. 2. As shown therein, the automatically compensated logic circuitry element 4 comprises a transistor of suitable type herein shown as a PNP type and indicated by the reference character T. The transistor T has a base electrode, an emitter electrode and a collector electrode. The emitter electrode is shown connected to ground or a reference potential. The collector electrode is connected to the output terminal Y. The base electrode is connected to a plurality of input terminals 6, 8 and 10, each terminal through a respective one of a plurality of impedance elements R1. The base electrode is also connected to a source of supply voltage of predetermined polarity, $+V_{BB}$, through an impedance element R3. Each input terminal is connected to a power supply of opposite polarity, $-V_{CC}$, through a respective one of a like plurality of impedance elements R2.

The impedance element R3 is chosen to be of a magnitude to allow control current of predetermined direction through the control electrode to emitter electrode to ground, to render the device to its non-conducting state. The impedance elements R2 and R1 are chosen to be of a magnitude to provide a control current of opposite direction through said control electrode; which current is of a magnitude sufficient to overcome the control current of predetermined direction hence rendering said device to its conducting state. In other words, the magnitudes of the impedance elements R1, R2 and R3 are selectively chosen so that the negative voltage source $V_{CC}$ is of sufficient magnitude to oppose the positive source $V_{BB}$ and a negative voltage results on the control electrode with respect to the grounded emitter. The transistor T shown to be of the PNP type is thereby biased to its conductive state. When the transistor T is in its conductive state the input terminals of following load connected logic elements are accordingly grounded.

Each input terminal 6, 8 and 10 when grounded provides a bypass through the impedance element R2 to ground for the control current of opposite direction flowing through its associated series circuit combination of R1 and R2. Hence, the control current of predetermined direction flows once more through the control electrode rendering the transistor T to its non-conducting state.

Assuming the parlance of the logic designer to hold the binary number 1 equal to a negative voltage input and the binary number 0 to be a ground connection, the power supply, $-V_{CC}$, may be considered to be a signal biasing supply providing an input signal through each series circuit impedance combination of R1 and R2 to the control electrode of the transistor T. Upon the individual grounding of each input terminal the signal biasing supply $-V_{CC}$, is rendered ineffective through its respective impedance element R2 to ground. Upon the grounding of all of the input terminals, the positive bias supply, $V_{BB}$, will provide a voltage of positive polarity on the base electrode with respect to the grounded emitter of the transistor T resulting, once again, in control current of predetermined direction, from control to emitter electrode to ground, and the transistor is rendered to its non-conducting state.

Circuit designers may interpret the present invention with the binary number 1 as a ground connection on the input terminal and a binary 0 as the negative voltage on each input terminal as provided from the negative signal biasing means $V_{CC}$. When so operated, the grounding of each input terminal may be regarded as an input signal. In this mode of operation, the logic element 4 shown in FIG. 2 in accordance with the present invention may be thought of as a NOT-AND function. Such a function is also known as NAND function or STROKE.

It is apparent that the magnitude of all the impedance elements utilized in the compensated logic circuit element 4 are of fixed value and may be readily encapsulated with the transistor T in a single package. One minor difference in the use of the basic circuit shown in FIG. 2 when compared with the prior art is that the unused input terminals must be grounded instead of being open-circuited. Any logic network that can be assembled with non-compensated logic elements of the prior art can be assembled in the same manner using the automatically compensated elements shown in FIG. 2. Since the signal level is determined by each series circuit impedance combination, the voltage across the following input impedance R2 and R1 forming the load for the logic element 4 is independent of the number of following elements so connected to be driven. The signal voltage of the compensated logic circuitry 4 is independent of the number of outputs, hence the minimum driving voltage necessary to drive each of the following stages into saturation is, except for tolerances, the same as the maximum allowable collector voltage when only one input terminal of a following stage is connected to the output terminal Y of the element 4. Accordingly, the minimum driving voltage condition is much less restrictive in comparison to the conventional non-compensated logic elements.

The disadvantages of the non-compensated NOR circuit of the prior art, previously mentioned, are overcome since the minimum driving voltage in the second condition is, except for tolerances, the same as the maximum voltage of the first condition.

Use of the automatically compensated transistor logic element 4 has several advantages of use of the non-compensated logic element of the prior art since for a prescribed maximum number of inputs and outputs, the element 4 requires less power. Or for a prescribed type of transistor, an automatically compensated logic element can be designed to accommodate a greater number of inputs and outputs. Stated another way, the input-output capacity for a given transistor used in either logic element is increased through the use of the element 4 as shown in FIG. 2.

Figure 3:
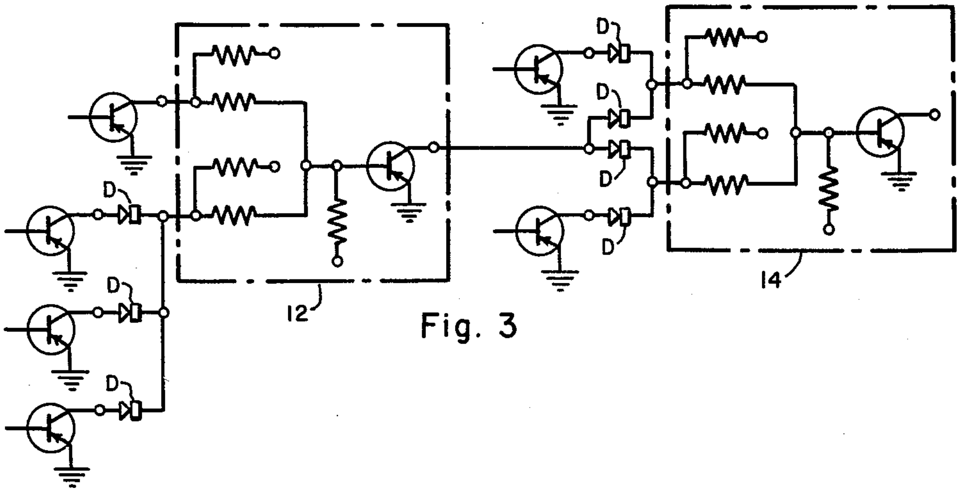
FIGS. 3, 4, 5 and 6 are schematic diagrams demonstrating the flexibility of the present invention in various logic and relay networks.

In addition to the advantages mentioned heretofore, common to all compensated logic element configurations, the particular form of logic element as shown in FIG. 2 has certain other circuit application advantages. For example, it is possible, as may be seen from FIG. 3, to use standard diode AND gates on either the input or output side of the transistor. FIG. 3 shows a typical logic network wherein diode AND gates are connected with automatically compensated logic elements 12 and 14 in accordance with the present invention. As can be seen therein, diode AND gates D, are connected on the input side of the elements 12 and 14 and diode AND gates are connected on the output side of the element 12. No additional resistors are required; the only extra components required are the diodes themselves. Such a configuration is not possible with non-compensated NOR elements since extra resistors would be required on the diode gate outputs, and the non-compensated NOR element may have no additional capacity to handle the extra current from these extra resistors.

Figure 4:
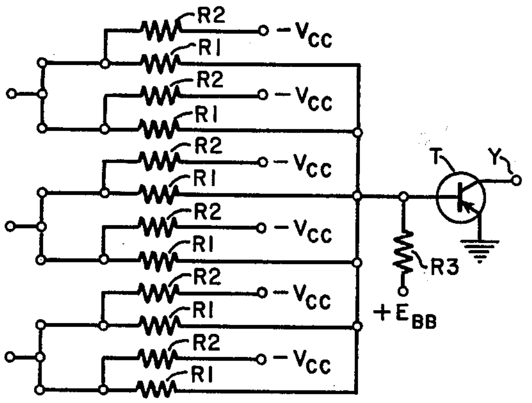
Figure 5:
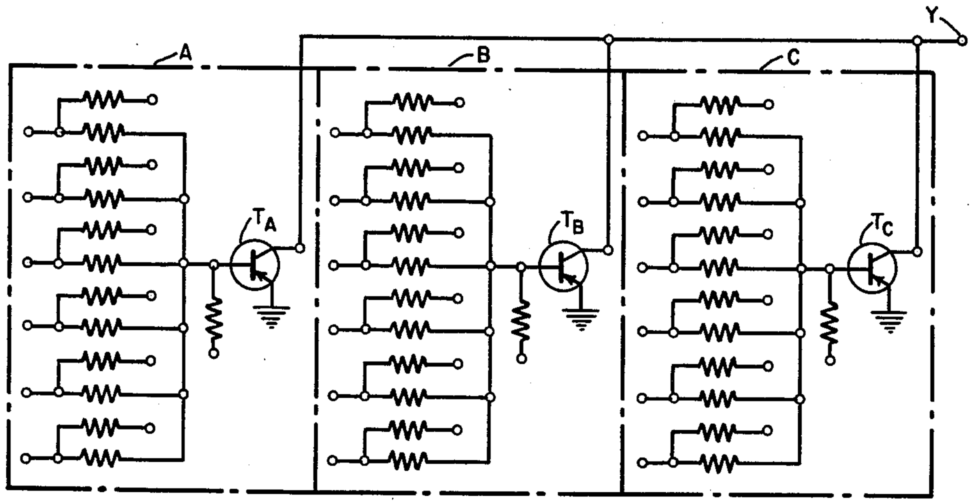
Figure 6:
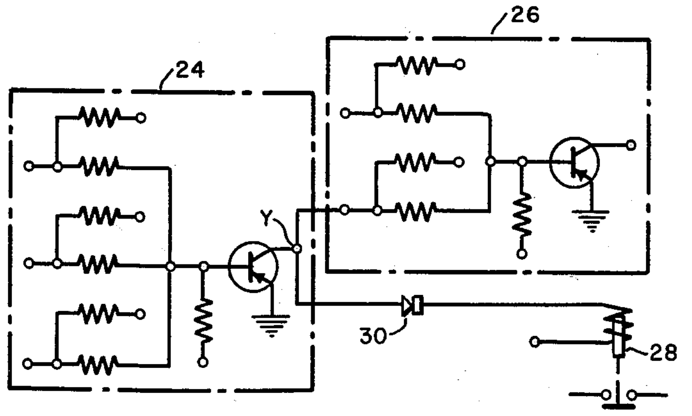

Other circuit advantages of the compensated logic element over the element of the prior art are demonstrated in FIGS. 4, 5 and 6.

From FIG. 4 it can be seen that the number of permissible outputs may be doubled by paralleling inputs. For example, a logic element designed to have six inputs and six outputs can be used to drive twelve outputs, if the inputs of each of the following stages are paralleled as shown in FIG. 4 to effectively give three input terminals per stage to preceding automatically compensated logic elements.

FIG. 5 illustrates the further flexibility of a logic element in accordance with the present invention in that the number of inputs may be effectively multiplied by paralleling several outputs. For example, an eighteen input logic element may be obtained from three logic elements A, B, and C, each having six inputs by paralleling the output terminals Y.

The two possibilities demonstrated in FIGS. 4 and 5 have an indirect advantage in that if large input or output fan-outs are required infrequently, each basic module or element can be designed to accommodate a smaller number, and the large requirements for input and output terminals can be met by the methods demonstrated in FIGS. 4 and 5. The result is a much lower overall power dissipation than would be required if all modules were designed to be able to accommodate the largest number of inputs or outputs required.

The automatically compensated logic element 4 in accordance with the present invention can switch a large variety of output devices or combinations of devices so long as the maximum voltage and current ratings are not exceeded. For example, FIG. 6 shows a logic network load and relay circuit load wherein it is demonstrated that an automatically compensated logic element 24 can control both an input to another compensated logic element 26 and also control a relay 28. The relay 28 is connected to the output terminal Y of the element 24 through a semiconductor diode 30 to prevent conduction in the reverse direction while the transistor of the preceding stage is cut-off.

Thus, it is readily apparent that the present invention provides a logic circuit element having great flexibility of application which makes it particularly attractive as a basic module for logic circuitry. When compared with the conventional non-compensated NOR module or logic element of the prior art, the flexibility is obtained at the cost of ($N_i$—1) additional resistors where $N_i$ equals the number of inputs; however, this is usually offset by the previously mentioned advantages of uniformity of design, and flexibility of application.

It is to be noted that if capacitor coupling is desirable between stages, it can be applied directly to the control electrode in any of the configurations shown by the drawings.

While the present invention has been described with a particular degree of exactness for the purposes of illustration, it is to be understood that all equivalents, modifications and alterations within the spirit and scope of the invention are herein meant to be included. For example, while PNP transistors have been illustrated, it is to be understood that NPN transistors may be used with appropriate changes in polarity of the connected voltages. The impedance elements R1 and R2 may be linear or non-linear impedances. For instance, impedance element R1 may be chosen to be a series circuit combination within itself of a plurality of rectifying elements or a parallel circuit combination of a capacitive and a resistive element.

I claim as my invention:

1. A circuit comprising, in combination; a semiconductor device having at least a control electrode, a collector electrode and an emitter electrode; first means for providing a control current of predetermined direction through said control electrode rendering said device to its non-conducting state; said first means including means for providing a supply voltage of predetermined polarity; a plurality of individual second means each operably connnected to the control electrode for individually providing a control current of opposite direction overcoming said first means and rendering said device to its conducting state; each said second means including means for providing a supply voltage of opposite polarity, and a series circuit combination of a first and a second impedance element connected between said means for providing a supply voltage of opposite polarity and said control electrode; and an input means for each said second means for rendering its respective second means inoperative in response to an input signal.

2. A circuit comprising, in combination; a semi-conductor device having at least a control electrode, a collector electrode and an emitter electrode; first means for providing a control current of predetermined direction through said control electrode rendering said device to its non-conducting state; said first means including means for providing a supply voltage of predetermined polarity; a plurality of individual second means each operably connected to the control electrode for individually providing a control current of opposite direction overcoming said first means and rendering said device to its conducting state; each said second means including means for providing a supply voltage of opposite polarity, and a series circuit combination of a first and a second impedance element connected between said means for providing a supply voltage of opposite polarity and said control electrode; and an input means for each said second means for rendering its respective second means inoperative in response to an input signal; each said input means including a terminal connection between the first and second impedance elements of its associated second means.

3. A circuit comprising, in combination; a semi-conductor device having at least a control electrode, a collector electrode and an emitter electrode; first means for providing a control current of predetermined direction through said control electrode rendering said device to its non-conducting state; said first means including means for providing a supply voltage of predetermined polarity; a plurality of individual second means each operably connected to the control electrode for individually providing a control current of opposite direction overcoming said first means and rendering said device to its conducting state; each said second means including means for providing a supply voltage of opposite polarity, and a series circuit combination of a first and a second impedance element connected between said means for providing a supply voltage of opposite polarity and said control electrode; and a like plurality of input means each for rendering a respective second means inoperative in response to an input signal; each said input means including a terminal connection between the first and second impedance elements of said respective second means; each said terminal connection adapted to be individually grounded thereby rendering its associated second means inoperative through the series circuit combination having its input terminal so grounded.

4. A circuit comprising, in combination; a semi-conductor device having at least a control electrode, a collector electrode and an emitter electrode, first means for providing a control current of predetermined direction through said control electrode rendering said device to its non-conducting state; a plurality of individual second means each operably connected to the control electrode for providing a control current of opposite direction through said control electrode, overcoming said first means and rendering said device to its conducting state; each said second means including means for providing a supply voltage of opposite polarity, and a series circuit combination of a first and a second impedance element connected between said means for providing a supply voltage of opposite polarity and said control electrode; and a like plurality of input terminals each connected between the first and second impedance elements of a respective second means, whereby the grounding of said input terminal substantially diverts said control current of the opposite direction from said control electrode.

5. A circuit comprising, in combination; a semi-conductor device having at least a control electrode, a collector electrode and an emitter electrode; first means for providing a control current of predetermined direction through said control electrode rendering said device to its non-conducting state; a plurality of individual second means each operably connected to the control electrode for providing a control current of opposite direction through said control electrode, overcoming said first means and rendering said device to its conducting state; each said second means including means for providing a supply voltage, and a series circuit combination of a first and a second impedance element connected between said means for providing a supply voltage and said control electrode; and a like plurality of input terminals each connected between a respective first and second impedance element for providing a current path for said control current of opposite polarity, bypassing said control electrode in response to an input signal applied to the associated input terminal.

6. A circuit comprising, in combination; a semi-conductive device having at least a control electrode, a collector electrode and an emitter electrode; a plurality of first impedance elements; a like plurality of second impedance elements; a third impedance element; a like plurality of input terminals each connected through a respective second impedance element to said control electrode; means for providing a power supply of predetermined polarity, connected through said third impedance element to said control electrode providing a current of predetermined direction therethrough; means for providing a power supply of opposite polarity, connected through a respective first impedance to a respective input terminal providing a control current of opposite direction through said control electrode; said control current of opposite direction being substantially diverted from said control electrode in response to an input signal to said respective input terminal.

7. A circuit comprising, in combination; a semi-conductive device having at least a control electrode, a collector electrode and an emitter electrode; a plurality of first impedance elements; a like plurality of second impedance elements; a third impedance element; a like plurality of input terminals each connected through a respective second impedance element to said control electrode; first means for providing a power supply of predetermined polarity, connected through said third impedance element to said control electrode providing a control current of predetermined direction therethrough rendering said device to its non-conductive state; second means for providing a power supply of opposite polarity, connected through a respective first impedance to a respective input terminal providing a control current of greater magnitude and of opposite direction through said respective second impedance and control electrode rendering said device to its conductive state; each said input terminal substantially reducing said control current of opposite direction through said respective second resistor and control electrode in response to an input signal, whereby the control electrode is returned to the sole influence of said control current of predetermined direction.

References Cited in the file of this patent

UNITED STATES PATENTS

| | | |
|---|---|---|
| 2,950,461 | Tryon | Aug. 23, 1960 |
| 2,964,653 | Cagle et al. | Dec. 13, 1960 |

Notice of Adverse Decision in Interference

In Interference No. 93,576 involving Patent No. 3,073,970, R. L. Bright, RESISTOR COUPLED TRANSISTOR LOGIC CIRCUITRY, final judgment adverse to the patentee was rendered June 30, 1965, as to claims 1, 2, 3, 4, 5, 6 and 7.

[*Official Gazette September 28, 1965.*]